(12) United States Patent
Kim

(10) Patent No.: US 8,809,177 B2
(45) Date of Patent: Aug. 19, 2014

(54) SEMICONDUCTOR DEVICE AND METHOD FOR MANUFACTURING THE SAME

(75) Inventor: Jong Man Kim, Seongnam-si (KR)

(73) Assignee: SK Hynix Inc., Gyeonggi-do (KR)

( * ) Notice: Subject to any disclaimer, the term of this patent is extended or adjusted under 35 U.S.C. 154(b) by 4 days.

(21) Appl. No.: 13/599,453

(22) Filed: Aug. 30, 2012

(65) Prior Publication Data

US 2013/0207176 A1 Aug. 15, 2013

(30) Foreign Application Priority Data

Feb. 13, 2012 (KR) .......................... 10-2012-0014231

(51) Int. Cl.
*H01L 29/788* (2006.01)
*H01L 21/78* (2006.01)

(52) U.S. Cl.
USPC .............. 438/594; 257/E29.3; 257/E27.209

(58) Field of Classification Search
USPC ................. 438/594; 257/239, 261, 314–321, 257/E29.3, E21.209
See application file for complete search history.

(56) References Cited

U.S. PATENT DOCUMENTS

2012/0146125 A1* 6/2012 Kim et al. ................. 257/321

* cited by examiner

*Primary Examiner* — Matthew W Such
*Assistant Examiner* — Monica D Harrison
(74) *Attorney, Agent, or Firm* — William Park & Associates Patent Ltd.

(57) ABSTRACT

A semiconductor device and a method for manufacturing the same are provided. The semiconductor device includes a gate pattern formed by patterning a tunnel insulating layer, a conductive film for a floating gate, a dielectric film, a conductive film for a control gate, and a gate metal film sequentially formed on a semiconductor substrate; a first barrier film formed on side walls of the gate metal film; and a second barrier film formed on an upper surface of the gate metal film.

11 Claims, 6 Drawing Sheets

SEMICONDUCTOR DEVICE AND METHOD FOR MANUFACTURING THE SAME

CROSS-REFERENCE TO RELATED APPLICATION

The present application claims priority to Korean patent application number 10-2012-0014231 filed on Feb. 13, 2012, the entire disclosure of which is incorporated herein by reference in its entirety.

BACKGROUND

1. Technical Field

Various embodiments relate generally to a semiconductor device and a method for manufacturing the same, and to a semiconductor device in which a gate metal film is restrained from being oxidized and a method for manufacturing the same.

2. Related Art

A gate pattern of a non-volatile memory device among semiconductor devices is formed by patterning a conductive film for a floating gate, a dielectric film, a conductive film for a control gate, and a gate metal film.

When a tungsten silicide (Wsix) film or a cobalt silicide (Co-six) film is used as a gate metal film in a semiconductor device having a size of 50 nm or smaller, since specific resistance of the tungsten silicide (Wsix) film or a cobalt silicide (Co-six) film is high, resistance Rs of word lines is increased to degrade a program speed and a read speed. In order to solve this problem, a thickness of the gate metal film may be increased. This method, however, makes it difficult to pattern word lines and potentially causes a void to be formed within a device separation film electrically separating word lines. Thus, a method of forming a gate electrode film by using a tungsten (W) film having specific resistance lower than that of the tungsten silicide (Wsix) film and a cobalt silicide (Co-six) film has been studied.

However, a tungsten (W) film is easily oxidized during a heating process and easily corroded in a cleaning solution during a cleaning process, causing restrictions on a follow-up process.

BRIEF SUMMARY

Various embodiments relate to a semiconductor device in which a gate electrode film is prevented from being abnormally oxidized, and a method for manufacturing the same.

A semiconductor device according to an embodiment of the includes: a gate pattern formed by patterning a tunnel insulating layer, a conductive film for a floating gate, a dielectric film, a conductive film for a control gate, and a gate metal film sequentially formed on a semiconductor substrate; a first barrier film formed on side walls of the gate metal film; and a second barrier film formed on an upper surface of the gate metal film.

A method for manufacturing a semiconductor device according to an embodiment includes: sequentially forming a tunnel insulating layer, a conductive film configured to be used as a floating gate, a dielectric film, a conductive film configured to be used as a control gate, and a sacrificial film on a semiconductor substrate; patterning the sacrificial film, the dielectric film, the conductive film configured to be used as a control gate, the dielectric film, and the conductive film configured to be used as a floating gate; forming an insulating layer in spaces between the patterned sacrificial film, the dielectric film, the conductive film configured to be used as a control gate, the dielectric film, and the conductive film configured to be used as a floating gate; removing the sacrificial film; forming a first barrier film on side walls of the insulating layer in the space from which the sacrificial film was removed; filling the spaces, from which the sacrificial film was removed, with a metal film to form a gate metal film; and forming a second barrier film on an upper portion of the gate metal film.

DETAILED DESCRIPTION

Figure 1:
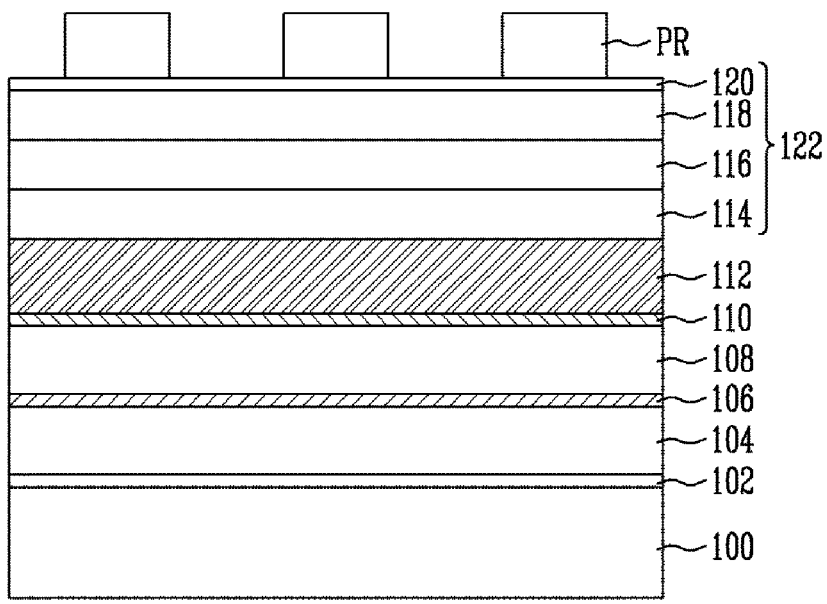
FIGS. 1 to 7 are cross-sectional views of elements illustrating a method for manufacturing a semiconductor device according to an embodiment.

Hereinafter, various embodiments of the present disclosure will be described with reference to the accompanying drawings. The figures are provided to allow those having ordinary skill in the art to understand the scope of the embodiments of the disclosure. Additionally, the same reference numerals or the same reference designators denote substantially the same elements throughout the specification.

FIGS. 1 to 7 are cross-sectional views of elements illustrating a method for manufacturing a semiconductor device according to an embodiment.

Referring to FIG. 1, a tunnel insulating layer 102, a conductive film 104 for a floating gate, a dielectric film 106, a conductive film 108 for a control gate, an anti-diffusion layer 110, a sacrificial film 112, and a hard mask film 122 are sequentially stacked on a semiconductor substrate 100.

Here, preferably, the tunnel insulating layer 102 is formed of an oxide film. The conductive film 104 for a floating gate and the conductive film 108 for a control gate may be formed by using a polysilicon film, and the dielectric film 106 may be formed to have an ONO structure including an oxide film, a nitride film, and an oxide film. Also, preferably, the anti-diffusion film 110 is formed of a WN film, and the sacrificial film 112 may be formed of a nitride film. The sacrificial film 112 may be formed to have a thickness of 1000 or greater.

The hard mask film 122 may be formed by sequentially stacking an oxide film 114, a polysilicon film 116, an amorphous carbon film 118, and an SiON film 120 (i.e., silicon oxynitride film).

Thereafter, a photoresist pattern (PR) is formed on the hard mask film 122.

Figure 2:
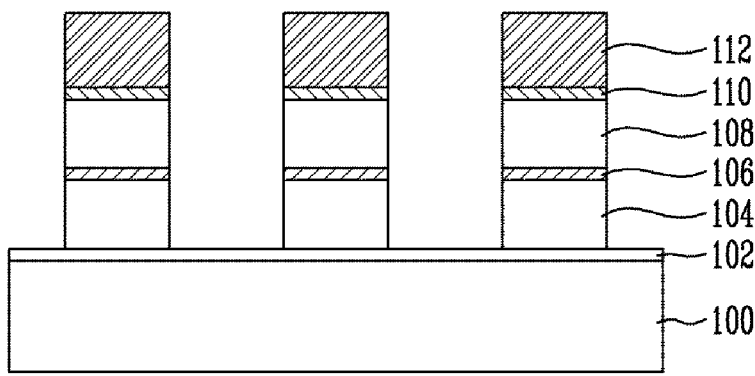

Referring to FIG. 2, an etching process using the photoresist pattern may be performed to pattern the hard mask film to form a hard mask film (not illustrated). Thereafter, an etching process using the mask film pattern as an etch mask may be performed to pattern the sacrificial film 112, the anti-diffusion film 110, the conductive film 108 for a control gate, the dielectric film 106, and the conductive film 104 for a floating gate.

Thereafter, the photoresist pattern and the hard mask pattern may be removed.

Figure 3:
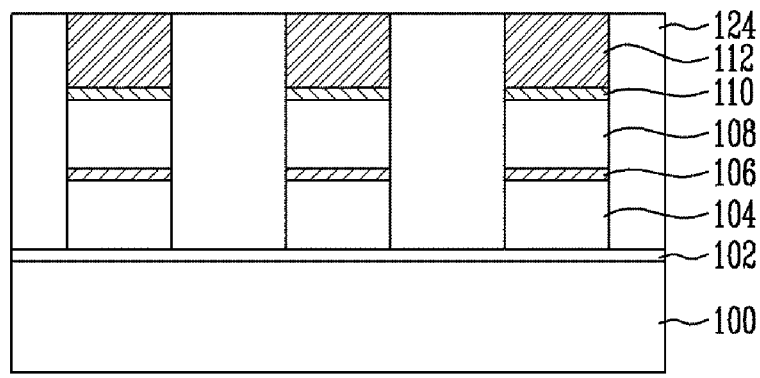

Referring to FIG. 3, an insulating layer 124 may be formed on the entire structure including the patterned sacrificial film 112, the anti-diffusion film 110, the conductive film 108 for a control gate, the dielectric film 106, and the conductive film 104 for a floating gate. Preferably, the insulating layer 124 is formed of an oxide film. Thereafter, an etching process may be performed to expose the sacrificial film 112. Preferably, the etching process is performed by using a chemical mechanical polishing (CMP) process. Accordingly, the insulating layer 124 may be formed in spaces between the patterned sacrificial film 112, the anti-diffusion film 110, the conductive film 108 for a control gate, the dielectric film 106, and the conductive film 104 for a floating gate.

Figure 4:
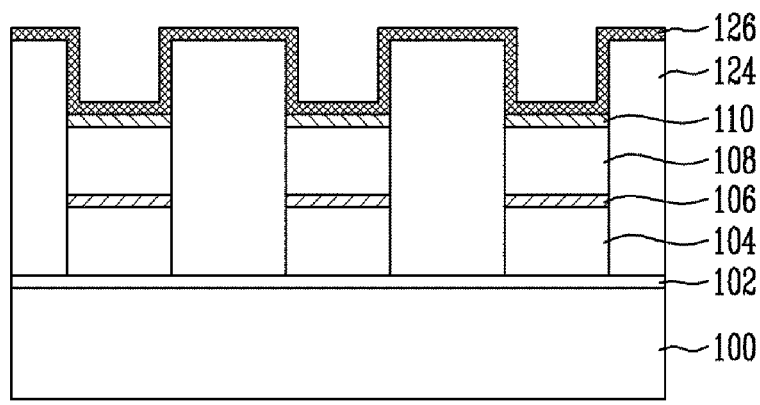

Referring to FIG. 4, the exposed sacrificial film 112 is removed. Thereafter, a first barrier film 126 may be formed on the upper surface of the entire structure. The first barrier film 126 may be formed of, for example, a nitride film. Also, the first barrier film 126 may be formed of a TiN film (i.e., Titanium Nitride film), a WN film (i.e., Tungsten Nitride film), or a WSix film.

Figure 5:
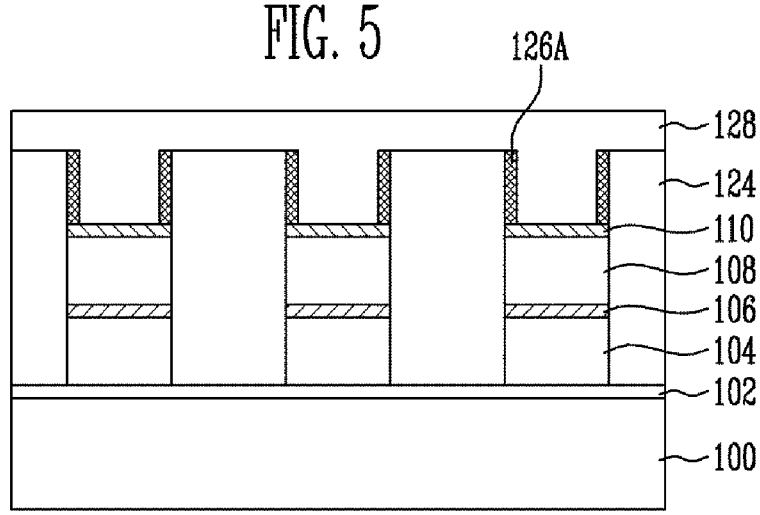

Referring to FIG. 5, an anisotropic etching is performed to remove the first barrier film 126 formed on the upper surface of the insulating layer 124 and the upper surface of the anti-diffusion film 110. Namely, the first barrier film 126A remains only on side walls in the spaces from which the sacrificial film was removed.

Thereafter, a metal film 128 is formed on the entire structure including the first barrier film 126A.

Figure 6:
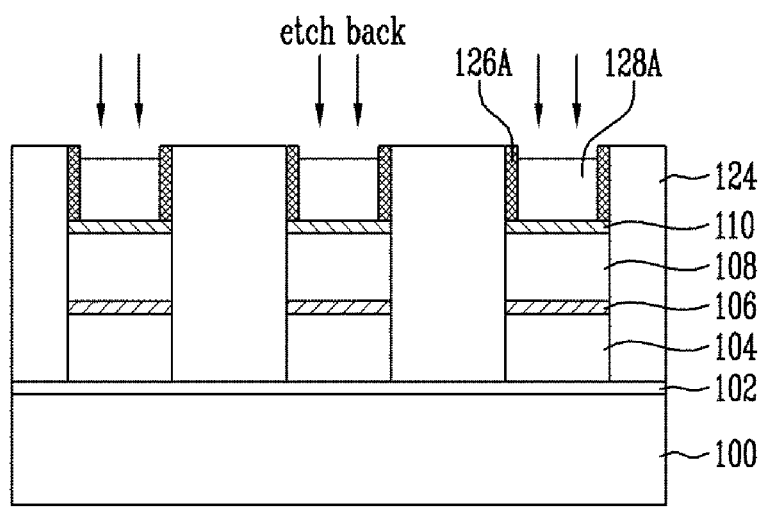

Referring to FIG. 6, a CMP process (i.e., chemical mechanical polishing process) may be performed such that an upper portion of the insulating layer 124 may be exposed. Accordingly, the metal film 128 remains in spaces between the first barrier films 126A to form a gate metal film 128A.

Thereafter, an etchback process may be performed to etch portions of the gate metal film 128A such that a height of the upper surface of the gate metal film 128A may be lower than a height of an upper portion of the insulating layer 124.

Figure 7:
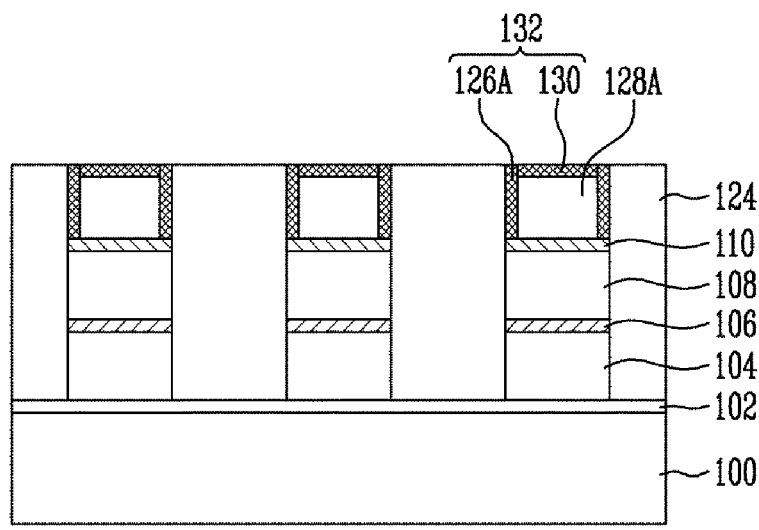

Referring to FIG. 7, a second barrier film 130 may be formed on an upper surface of the gate metal film 128A. Preferably, the second barrier film 130 is formed of a nitride film.

According to an embodiment, barrier films 132 (126A and 130) may be formed on side walls and an upper portion of the gate metal film 128A made of tungsten, restraining abnormal oxidization of the gate metal film 128A. Also, a cleaning solution is prevented from being in contact with the gate metal film 128A in a follow-up cleaning process, restraining a corrosion phenomenon and a dissolution phenomenon.

FIGS. 8 to 13 are cross-sectional views of elements illustrating a method for manufacturing a semiconductor device according to an embodiment.

Figure 8:
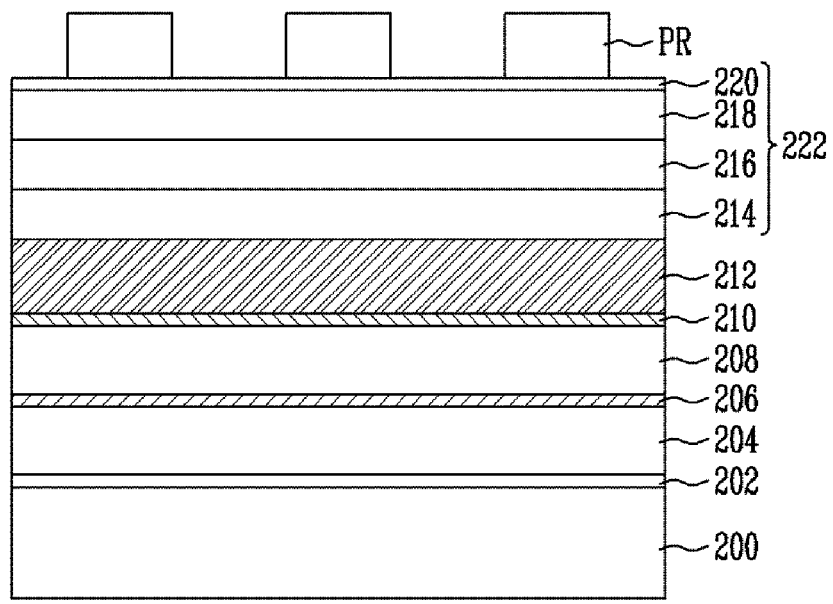
FIGS. 8 to 13 are cross-sectional views of elements illustrating a method for manufacturing a semiconductor device according to an embodiment.

Referring to FIG. 8, a tunnel insulating layer 202, a conductive film 204 for a floating gate, a dielectric film 206, a conductive film 208 for a control gate, an anti-diffusion layer 210, a sacrificial film 212, and a hard mask film 222 are sequentially stacked on a semiconductor substrate 200.

Here, preferably, the tunnel insulating layer 202 is formed of an oxide film. The conductive film 204 for a floating gate and the conductive film 208 for a control gate may be formed by using a polysilicon film, and the dielectric film 206 may be formed to have an ONO structure including an oxide film, a nitride film, and an oxide film. Also, preferably, the anti-diffusion film 210 is formed of a WN film, and the sacrificial film 212 may be formed of a nitride film. The sacrificial film 212 may be formed to have a thickness of 1000 or greater.

Here, the process of forming the anti-diffusion film 210 may be skipped. This will be described hereinafter.

The hard mask film 222 may be formed by sequentially stacking an oxide film 214, a polysilicon film 216, an amorphous carbon film 218, and an SiON film 220.

Thereafter, a photoresist pattern (PR) may be formed on the hard mask film 222.

Figure 9:
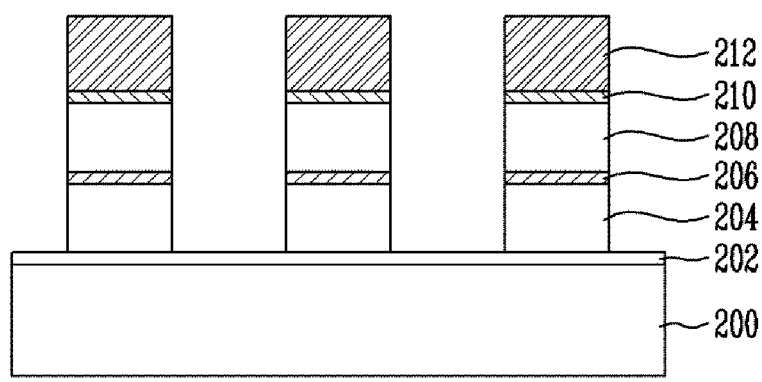

Referring to FIG. 9, an etching process using the photoresist pattern may be performed to pattern the hard mask film to form a hard mask film (not illustrated). Thereafter, an etching process using the mask film pattern as an etch mask may be performed to pattern the sacrificial film 212, the anti-diffusion film 210, the conductive film 208 for a control gate, the dielectric film 206, and the conductive film 204 for a floating gate.

Thereafter, the photoresist pattern and the hard mask pattern may be removed.

Figure 10:
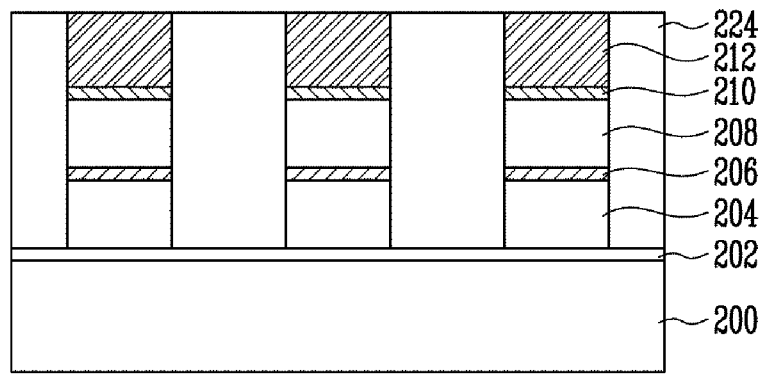

Referring to FIG. 10, an insulating layer 224 may be formed on the entire structure including the patterned sacrificial film 212, the anti-diffusion film 210, the conductive film 208 for a control gate, the dielectric film 206, and the conductive film 204 for a floating gate. Preferably, the insulating layer 224 is formed of an oxide film. Thereafter, an etching process may be performed to expose the sacrificial film 212. Preferably, the etching process is performed by using a chemical mechanical polishing (CMP) process.

Figure 11:
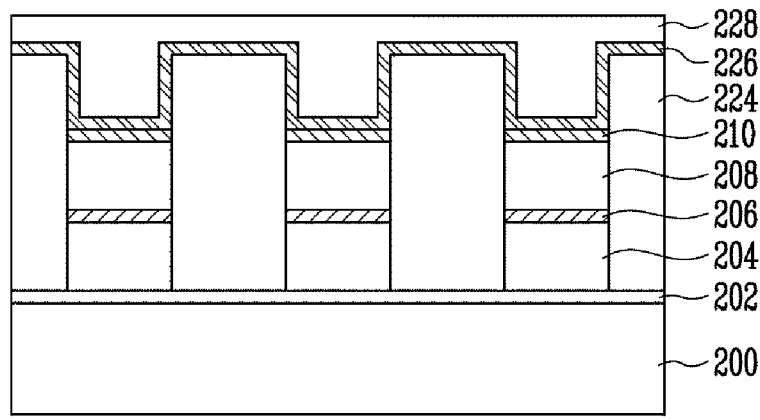
Figure 12:
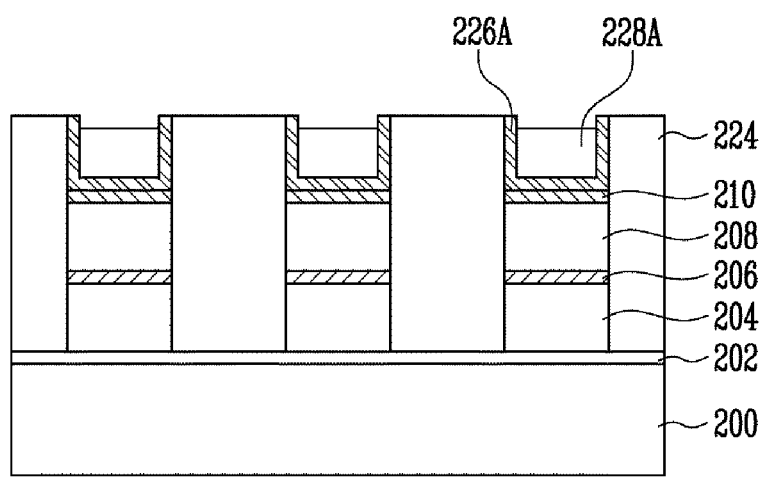

Referring to FIG. 11, the exposed sacrificial film 212 is removed. Thereafter, a first barrier film 226 may be formed on the upper surface of the entire structure. The first barrier film 226 may be formed of a TiN film, a WN film, or a WSix film. When the anti-diffusion film 210 is not formed but skipped in the process of FIG. 8, the first barrier film 226 may be used to serve as an anti-diffusion film, as well as preventing an abnormal oxidization of a gate electrode film formed in a follow-up process.

Referring to FIG. 11, a metal film 228 may be formed on the entire structure including the first barrier film 226. The metal film may be made of, for example, tungsten.

Thereafter, a CMP process is performed to etch portions of the metal film 228 and the first barrier film 226 such that an upper portion of the insulating layer 224 may be exposed. Accordingly, the metal film 228 remains only in spaces from which the sacrificial film was removed, to form a gate metal film 228A. Here, the first barrier film 226A substantially covers the side walls and a lower surface of the gate metal film 228A.

Thereafter, an etchback process may be performed to etch portions of the gate metal film 228A such that a height of the upper surface of the gate metal film 228A is lower than a height of an upper portion of the insulating layer 224.

Figure 13:
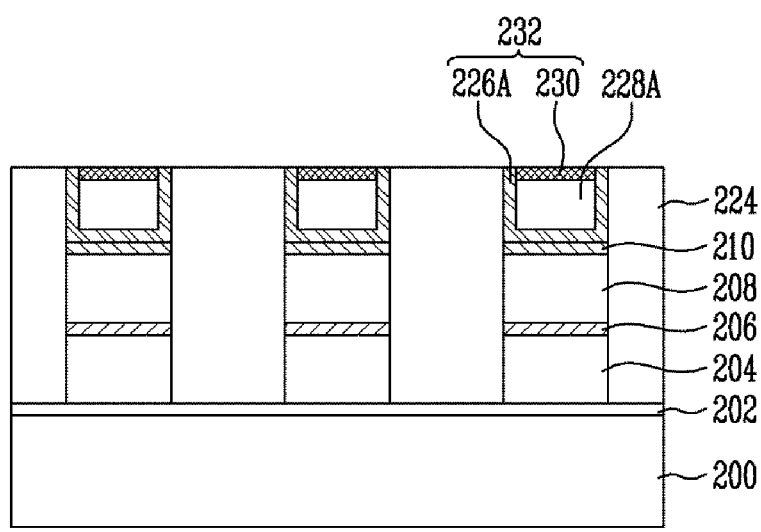

Referring to FIG. 13, a second barrier film 230 may be formed on an upper surface of the gate metal film 228A. Preferably, the second barrier film 230 is formed of a nitride film.

According to an embodiment, barrier films 232 (226A and 230) may be formed on side walls and an upper portion of the gate metal film 228A made of tungsten, restraining abnormal oxidization of the gate metal film 228A. Also, a cleaning solution is prevented from being in contact with the gate metal film 228A in a follow-up cleaning process, restraining a corrosion phenomenon and a dissolution phenomenon. Also, since the first barrier film 226A may be formed on the lower portion of the gate metal film 228, although the extra anti-diffusion film 210 is not formed, the first barrier film 226A may serve as an anti-diffusion film. Thus, a process of forming the anti-diffusion film 210 may be skipped.

In accordance with the present disclosure, an abnormal oxidization of the gate metal film of the gate pattern can be prevented, and corrosion of the gate metal film during a follow-up cleaning process can be restrained.

While the present invention has been illustrated and described in connection with the embodiments, it will be apparent to those skilled in the art that modifications and variations can be made without departing from the spirit and scope of the invention as defined by the appended claims.

What is claimed is:

1. A method for manufacturing a semiconductor device comprising:

forming a tunnel insulating layer, a conductive film configured to be used as a floating gate, a dielectric film, a conductive film configured to be used as a control gate, and a sacrificial film on a semiconductor substrate;

patterning the sacrificial film, the dielectric film, the conductive film configured to be used as a control gate, the dielectric film, and the conductive film configured to be used as a floating gate;

forming an insulating layer in spaces between the patterned sacrificial film, the dielectric film, the conductive film configured to be used as a control gate, the dielectric film, and the conductive film configured to be used as a floating gate;

removing the sacrificial film;

forming a first barrier film on side walls of the insulating layer in the space from which the sacrificial film was removed;

filling the spaces, from which the sacrificial film was removed, with a metal film to form a gate metal film; and forming a second barrier film on an upper portion of the gate metal film.

2. The method of claim 1, wherein the forming of the first barrier film comprises:

forming a first barrier film on a surface of an entire structure including surfaces of spaces formed as the sacrificial film was removed; and performing an etching process such that the first barrier film remains on side walls of the insulating layer.

3. The method of claim 1, wherein the first barrier film and the second barrier film are formed of nitride films.

4. The method of claim 1, wherein the first barrier film is formed of a TiN film, a WN film, or a WSix film.

5. The method of claim 1, further comprising:

forming an anti-diffusion film on the conductive film for a control gate, before the formation of the sacrificial film.

6. The method of claim 1, wherein the forming of the gate metal film comprises:

forming a metal film on the entire structure including the first barrier film;

performing a chemical mechanical polishing (CMP) process to form the gate metal film such that an upper portion of the insulating layer is exposed;

performing an etchback process to etch an upper portion of the gate metal film such that a height of an upper surface of the gate metal film is lower than a height of an upper surface of the insulating layer.

7. The method of claim 1, wherein in the forming of the first barrier film on side walls of the insulating layer in the spaces from which the sacrificial film was removed, the first barrier film is formed on a lower portion in the spaces from which the sacrificial film was removed.

8. The method of claim 1, wherein the side walls and an upper surface of the gate electrode film are substantially covered by the first and second barrier films.

9. The method of claim 1, wherein the side walls of the gate electrode film are substantially covered by the first barrier film, and the upper surface of the gate electrode film is substantially covered by the second barrier film.

10. The method of claim 1, wherein the side walls and a lower surface of the gate electrode film are substantially covered by the first barrier film, and the upper surface of the gate electrode film is substantially covered by the second barrier film.

11. The method of claim 1, wherein the gate electrode film is made of tungsten.

* * * * *